(12) United States Patent
Aoki

(10) Patent No.: US 9,064,624 B2
(45) Date of Patent: Jun. 23, 2015

(54) CONTROLLING DEVICE

(71) Applicant: Azbil Corporation, Tokyo (JP)

(72) Inventor: Takanori Aoki, Tokyo (JP)

(73) Assignee: Azbil Corporation, Tokyo (JP)

( * ) Notice: Subject to any disclaimer, the term of this patent is extended or adjusted under 35 U.S.C. 154(b) by 28 days.

(21) Appl. No.: 13/950,607

(22) Filed: Jul. 25, 2013

(65) Prior Publication Data

US 2014/0028419 A1   Jan. 30, 2014

(30) Foreign Application Priority Data

Jul. 25, 2012   (JP) ................. 2012-164398

(51) Int. Cl.
*H01F 1/00* (2006.01)
*H01F 7/02* (2006.01)
*G01R 33/038* (2006.01)

(52) U.S. Cl.
CPC ............... *H01F 7/02* (2013.01); *G01R 33/038* (2013.01)

(58) Field of Classification Search
USPC .................. 335/219, 202; 439/489, 188, 76.1
See application file for complete search history.

(56) References Cited

U.S. PATENT DOCUMENTS

| | | | | | |
|---|---|---|---|---|---|
| 2,573,920 | A | * | 11/1951 | McLeod | ..................... 200/51.09 |
| 3,521,216 | A | * | 7/1970 | Tolegian | ......................... 439/39 |
| 3,868,160 | A | * | 2/1975 | Kersman | ......................... 439/39 |
| 4,156,265 | A | * | 5/1979 | Rose | .............................. 361/179 |
| 4,915,639 | A | * | 4/1990 | Cohn et al. | ..................... 439/188 |
| 5,997,360 | A | * | 12/1999 | Gen-Kuong et al. | ......... 439/700 |
| 6,806,701 | B2 | * | 10/2004 | Apel et al. | ................. 324/207.2 |
| 6,897,370 | B2 | * | 5/2005 | Kondo et al. | ................. 136/243 |
| 7,782,164 | B2 | * | 8/2010 | Tiberghien et al. | ........... 335/285 |
| 7,901,216 | B2 | * | 3/2011 | Rohrbach et al. | .............. 439/39 |
| 8,011,936 | B2 | * | 9/2011 | Goto | ............................ 439/76.1 |
| 8,435,042 | B2 | * | 5/2013 | Rohrbach et al. | .............. 439/39 |
| 8,731,405 | B2 | * | 5/2014 | Renfro et al. | ................. 398/117 |
| 2010/0323539 | A1 | * | 12/2010 | Goto | ........................... 439/76.1 |
| 2011/0063061 | A1 | * | 3/2011 | Fullerton et al. | ............. 335/306 |

FOREIGN PATENT DOCUMENTS

| | | |
|---|---|---|
| JP | H8-31516 A | 2/1996 |
| JP | H11-126654 A | 5/1999 |
| JP | 2000-323236 A | 11/2000 |
| JP | 2010-146958 A | 7/2010 |

* cited by examiner

*Primary Examiner* — Alexander Talpalatski
(74) *Attorney, Agent, or Firm* — Troutman Sanders LLP

(57) ABSTRACT

A controlling device includes a controlling device main unit and a terminal block attached removably to the controlling device main unit. The terminal block is provided with first through $N^{th}$ ($N \geq 2$) permanent magnet placement portions. The controlling device main unit includes first through $N^{th}$ magnetism detecting portions that, in a state wherein the terminal block is attached, are positioned in positions in proximity to the first through $N^{th}$ permanent magnet placement portions, to detect the respective magnetism of the permanent magnets that are placed selectively in the placement portions. The controlling device further includes a terminal block type identifying portion that identifies a type of terminal block attached to the controlling device main unit based on detection signals, indicating whether or not there is magnetism, from the first through $N^{th}$ magnetism detecting portions.

3 Claims, 14 Drawing Sheets

(a)

(b)

CONTROLLING DEVICE

CROSS REFERENCE TO RELATED APPLICATION

The present application claims priority under 35 U.S.C. §119 to Japanese Patent Application No. 2012-164398, filed Jul. 25, 2012, the entire content of which being hereby incorporated herein by reference.

FIELD OF TECHNOLOGY

The present invention relates to a controlling device comprising a controlling device main unit and a terminal block that is attached removably to the controlling device main unit.

BACKGROUND

Controlling devices, such as temperature adjusting instruments, communication devices, display devices, driving devices, input/output devices, and power supply devices, are equipped with terminal blocks for inputting power and signals from sensors, or the like, and for outputting signals to the devices that are controlled. In recent years, structures wherein the terminal blocks can be removed from the controlling device main units have been used in order to enhance convenience in operations at the time of maintenance operations, and to accommodate miniaturization of the equipment. See, for example, Japanese Unexamined Patent Application Publication 2010-146958.

In controlling devices having such a structure, there are many different types of terminal blocks, having, for example, different specifications and functions, and thus it is necessary to not perform processes for various types of signals for a terminal block other than a type that has been defined in advance.

Because of this, there have been innovations for providing mechanical shapes with protrusions or cutouts in the fitting parts so as to prevent multiple connectors from fitting easily when installing a terminal plot by connecting wires using a connector, or the like.

For example, the types of terminal blocks can be identified through having connectors with recessed or raised portions with different lengths, as shown in Japanese Unexamined Patent Application Publication H11-126654, through offsetting the fitting positions of the connectors, as shown in Japanese Unexamined Patent Application Publication H8-31516, or through insertion of an incorrect-insertion-preventing part in a particular spot with in the connector, as shown in Japanese Unexamined Patent Application Publication 2000-323236.

However, in the method for differentiating the types of connector blocks through having differences in the shapes of the connectors, the point is that of preventing the insertion of an incorrect connector, and thus the types of terminal blocks that can be differentiated are limited.

Moreover, because in order to produce a difference in the shape of the connector it is necessary to modify the shape when designing the die for manufacturing, and, at the time of manufacturing, to change the die for each different shape, handling a large number of products requires an excessive amount of work.

Note that one may consider using some of the pins of the connector to differentiate the type of terminal block electrically. However, in such a method some of the pins of the connector will be assigned to a function for identifying the type of terminal block, which would prevent those pins from being used for the actual application.

The present invention is to solve this type of problem, and an aspect thereof is to provide a controlling device able to identify the type of terminal block that is attached, without differences in the connector shapes and without using a portion of the pins of the connector.

SUMMARY

The present invention, in order to achieve such an aspect, provides a controlling device including a controlling device main unit and a terminal block attached removably to the controlling device main unit. The terminal block is provided with first through $N^{th}$ ($N \geq 2$) permanent magnet placement portions. The controlling device main unit comprises: first through $N^{th}$ magnetism detecting portions that, in a state wherein the terminal block is attached, are positioned in positions in proximity to the first through $N^{th}$ permanent magnet placement portions, to detect the respective magnetism of the permanent magnets that are placed selectively in the placement portions. The controlling device further includes a terminal block type identifying portion for identifying a type of terminal block attached to the controlling device main unit based on detection signals, indicating whether or not there is magnetism, from the first through $N^{th}$ magnetism detecting portions.

In the present invention, whether or not a terminal block attached to the controlling device main unit is a terminal block of a type that has been defined in advance is identified based on detection signals, indicating whether or not there is magnetism, from the first through $N^{th}$ magnetism detecting portions, or the type of terminal block, of a plurality of types that have been defined in advance, of a terminal block that is attached to the controlling device main unit is identified based on detection signals, indicating whether or not there is magnetism, from the first through $N^{th}$ magnetism detecting portions.

The present invention may be structured so as to identify, from a detection signal, indicating whether or not there is magnetism, from one magnetism detecting portion established in advance from among the first through $N^{th}$ magnetism detecting portions, whether or not a terminal block is attached to the controlling device main unit, and to identify the type of terminal block that is attached to the controlling device main unit, based on detection signals, indicating whether or not there is magnetism, from the other magnetism detecting portions.

Moreover, the present invention may be structured to identify whether or not to stop functions of various types of signal processing between the controlling device main unit and the terminal block, together with identifying the type of terminal block attached to the controlling device main unit, based on information indicating Allowed or Not-allowed, set for each individual terminal block of a plurality of types. In this case, it may be structured so that the information indicating Allowed or Not-allowed is set for each terminal block of the plurality of types through communication through an external device that is connected.

Note that, in the present invention, the permanent magnet placement portions preferably are provided in positions wherein the magnetic fields of the permanent magnets that are placed in those placement portions do not interfere with each other. Doing so enables reliable detection of magnetism without incorrectly detecting each other through magnetic interference.

In the present invention, the terminal block is provided with first through $N^{th}$ (where N≥2) permanent magnet placement portions, and the controlling device main unit is provided with first through $N^{th}$ magnetism detecting portions which, when in a state wherein the terminal block is attached, are positioned at positions in proximity to the first through $N^{th}$ permanent magnet placement portions, to detect the magnetism of the permanent magnets that are positioned selectively in the placement portions, where the type of terminal block that is attached to the controlling device main unit is identified based on the detection signals, indicating the presence or absence of magnetism, from the first through $N^{th}$ magnetism detecting portions, thus making it possible to identify the type of terminal block that is attached, without having a difference in the shape of the connector and without using a portion of the pins of the connector.

DETAILED DESCRIPTION

Figure 1:
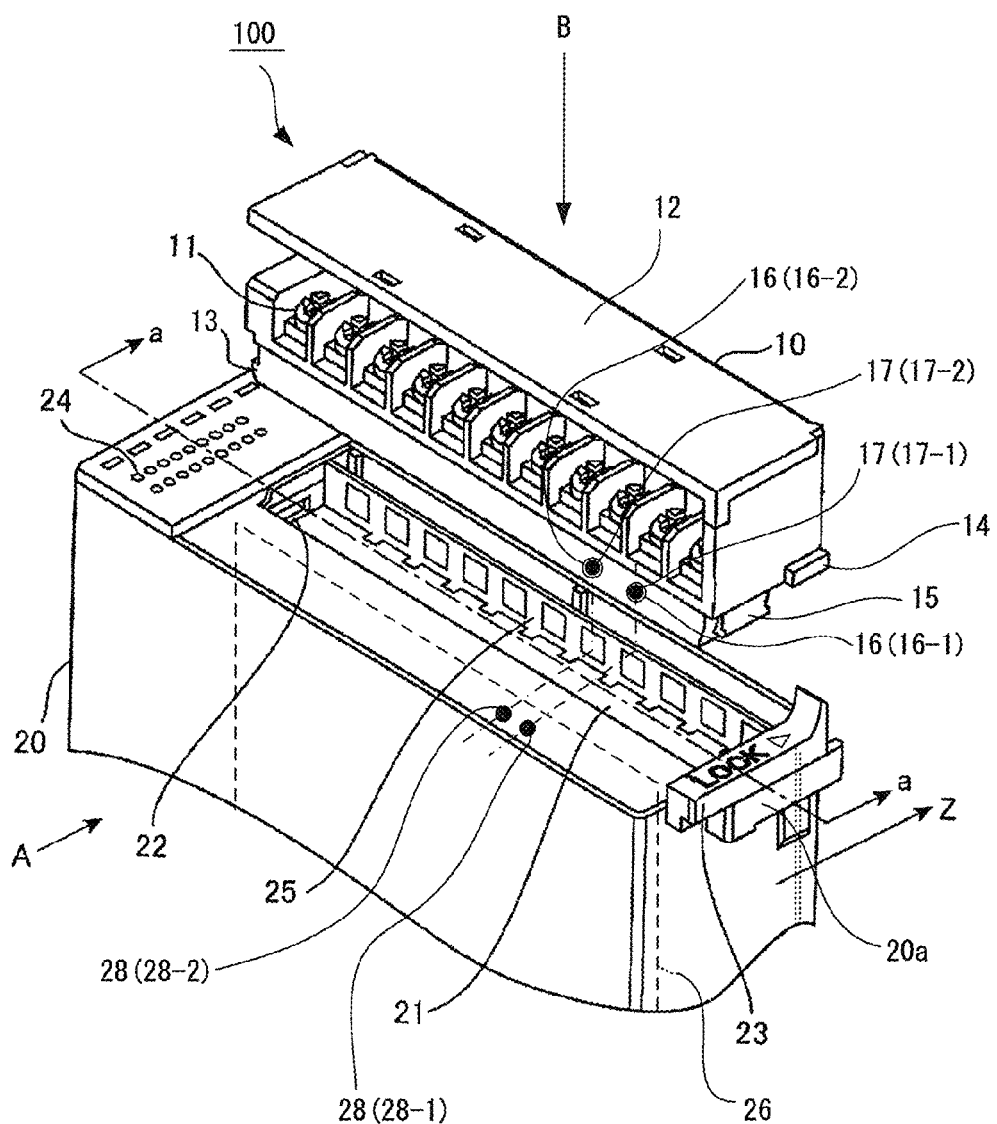
FIG. 1 is an assembly perspective diagram illustrating the structure of an example of a controlling device according to the present invention.

An example according to the present invention will be explained below in detail, based on the drawings. FIG. 1 is an assembly perspective diagram illustrating the structure of an example of a controlling device according to the present invention.

In the present example, the controlling device 100 is structured from a terminal block 10, having a plurality of terminal portions 11, and a controlling device main unit 20, having a terminal block attaching opening 21 for attaching the terminal block 10.

The terminal block 10 is provided with a plurality of terminal portions 11, and a terminal cover 12 for covering over the terminal portions 11, where a first protruding portion 13 is provided in the vicinity of the bottom face on one end in the lengthwise direction, and a second protruding portion 14 and a third protruding portion 15 are provided in the vicinity of the bottom face on the other end in the lengthwise direction. The first, second, and third protrusions 13, 14, and 15 are key-shaped or tab-shaped.

Moreover, on the lower front face portion of the terminal block 10 a plurality of permanent magnet placement portions 16 are formed in a horizontal row, and permanent magnets 17 are placed selectively into this plurality of permanent magnet placement portions 16. In this example, a first permanent magnet placement portion 16-1 and a second permanent magnet placement portion 16-2 are formed as the permanent magnet placement portions 16, where a first permanent magnet 17-1 is placed in the first permanent magnet placement portion 16-1 and a second permanent magnet 17-2 is placed in the second permanent magnet placement portion 16-2.

Note that the permanent magnet placement portion 16 is a cylindrically-shaped hole that has a bottom, where, in the state wherein a small permanent magnet 17 is pressed therein, this hole is filled. Moreover, the permanent magnet placement portions 16 are provided at locations so that adjacent permanent magnets 17 do not interfere with each other. That is, the gaps between the placement of the permanent magnet placement portions 16 have enough separation that the magnetic fields of the permanent magnets 17 that are placed in these placement portions 16 do not interfere with each other. Doing so enables reliable detection of magnetism without incorrectly detecting each other through magnetic interference.

Figure 7:
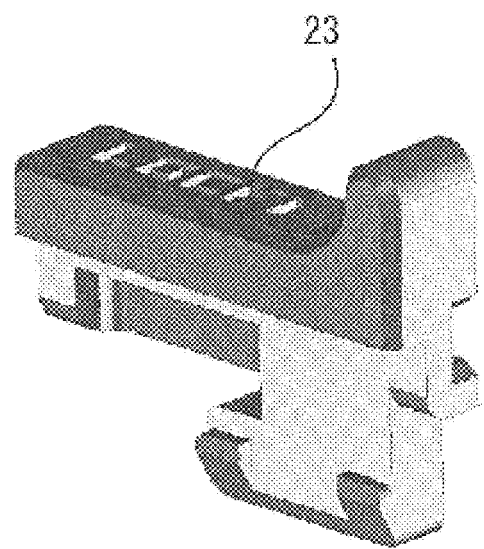
FIG. 7 is a perspective diagram of the slide member in the controlling device.

The controlling device main unit 20 is provided, on the inside of one lengthwise-direction end of the terminal block attaching opening 21, with a fitting indentation 22 into which the first protruding portion 13 can fit, and is provided with a securing member 20a on the side face on the other lengthwise-direction end of the terminal block attaching opening 21. A slide member 23, which moves sliding in the direction of the arrow Z on the securing member 20a, to lock the terminal block 10 that is attached to the controlling device main unit 20 is provided on the top face of the securing member 20a. The locking of the terminal block 10 by the slide member 23 will be described below. Moreover, a displaying portion 24 is provided on the top face of the controlling device main unit 20, and printed substrates 25 and 26 are contained on the inside of the controlling device main unit 20. FIG. 7 is an oblique view of the slide member.

Figure 2:
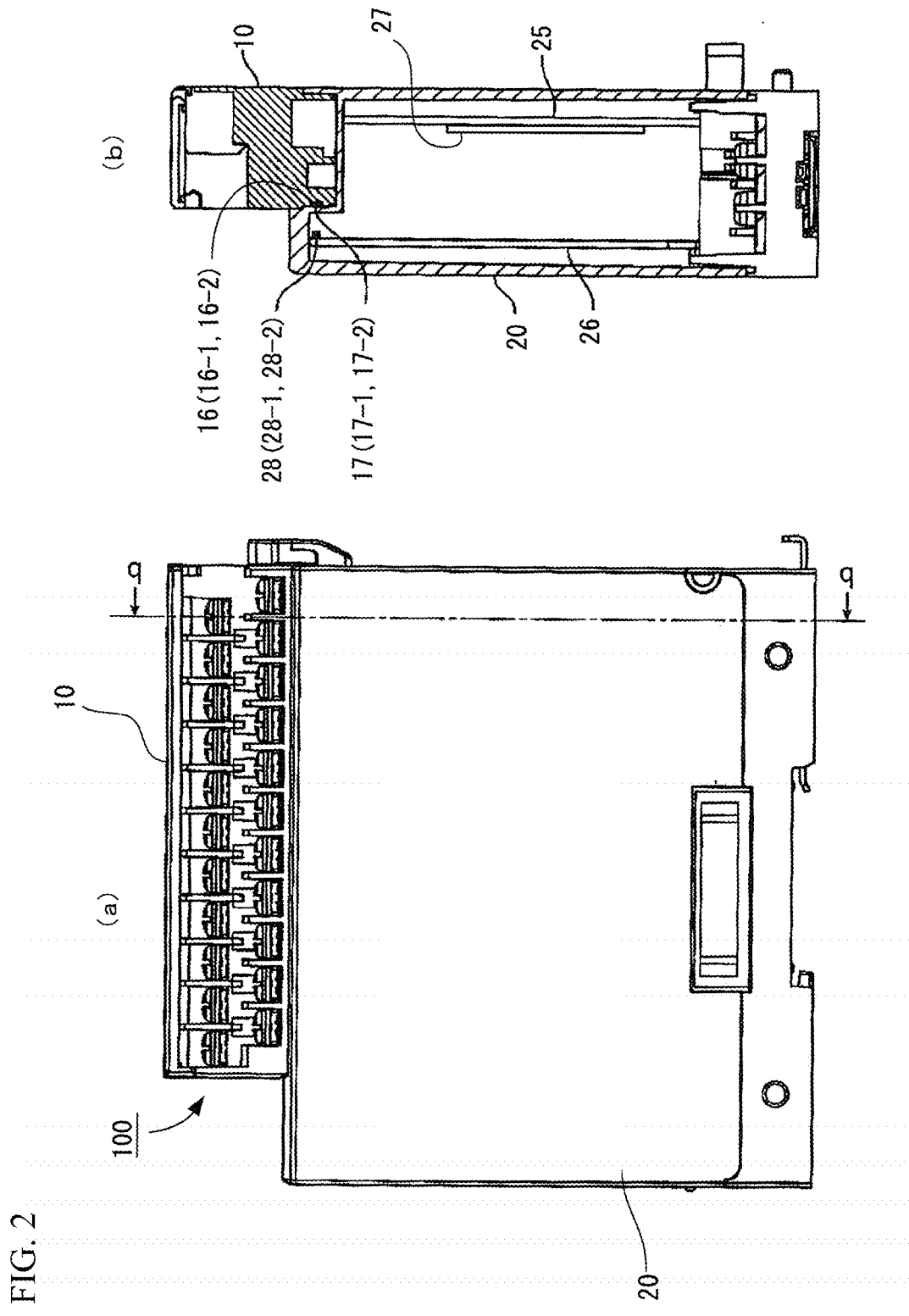
FIG. 2 is a side view diagram of the controlling device and a cross-sectional diagram illustrating schematically the structure of the internal portion thereof.

FIG. 2 is a side view of the controlling device 100 and a cross-sectional diagram illustrating the schematic structure of the interior thereof, where FIG. 2(a) is a side view of the controlling device 100 when viewed from the A direction in FIG. 1, and FIG. 2(b) is a cross-sectional diagram along the section b-b in FIG. 2(a). A controlling portion 27, structured from a CPU, a microcontroller, or the like, is mounted on the printed substrate 25 that is contained within the controlling device main unit 20. Moreover, first and second Hall ICs 28-1 and 28-2 are provided on a printed substrate 26 that is contained within the controlling device main unit 20, positioned at a position that, in the state wherein the terminal block 10 is attached, is in proximity to the first and second permanent magnet placement portions 16-1 and 16-2, to detect, respectively, the first and second permanent magnets 17-1 and 17-2 that are placed in the placement portions 16-1 and 16-2. These Hall ICs 28 (28-1 and 28-2) correspond to the magnetism detecting portions in the present invention.

Attaching the Terminal Block to the Controlling Device Main Unit

Figure 3:
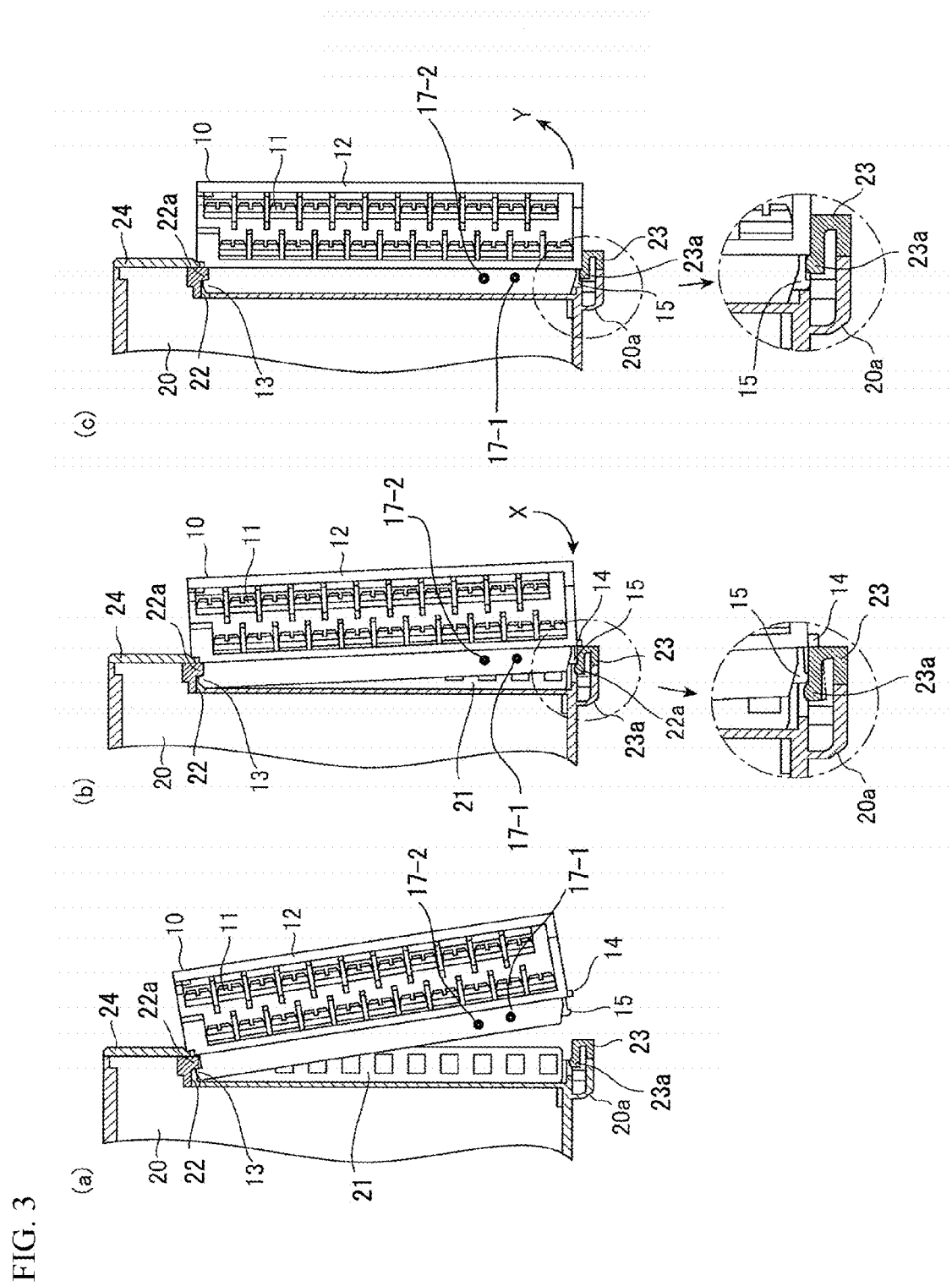
FIG. 3 is an explanatory diagram illustrating the procedure for attaching the terminal block to the controlling device main unit in the controlling device.

FIG. 3 is an explanatory diagram illustrating the procedure for attaching the terminal block 10 to the controlling device main unit 20, shown for the cross-sectional diagram along the section a-a in FIG. 1. The procedure for attaching the terminal block 10 to the controlling device main unit 20 is shown in the sequence from FIG. 3(a) through (c).

First, as illustrated in FIG. 3(a), the first protruding portion 13 that is provided on one lengthwise-direction end of the terminal block 10 is fitted into the fitting indentation 22 of the terminal block attaching opening 21. Following this, as illustrated in FIG. 3(b), the bottom side end portion of the terminal block 10 is pushed in the direction of the arrow X.

The slide member 23 is provided on the securing member 20a on the side face on the other lengthwise-direction end of the terminal block attaching opening 21. The cross-sectional shape of this slide member 23 is essentially a block-U shape, and a locking portion 23a that protrudes toward the inside of the terminal block attaching opening 21 is formed on the end portion that has this block-U shape.

When the bottom side end portion of the terminal block 10 is pushed in the direction of the arrow X, the pressure causes the third protruding portion 15 of the terminal block 10 to push against the locking portion 23a of the slide member 23, and when pushed further, the locking portion 23a flexes as shown by the dotted line in the expanded view in FIG. 3(b), enabling the third protruding portion 15 to go past the locking portion 23a. Thereafter, the release of the flexing of the locking portion 23a causes the key-shaped (tab-shaped) protrusion of the third protruding portion 15 to interlock with a protruding part of the locking portion 23a, to provisionally secure the terminal block 10 to the controlling device main unit 20.

The state wherein the terminal block 10 is provisionally secured to the controlling device main unit 20 is illustrated in FIG. 3(c). When in this provisionally secured state, even if a force were to be applied to the terminal block 10 in the direction of the arrow Y, a catch portion 22a is formed between the fitting indentation 22 and the displaying portion 24, that is, on the side face of the fitting indentation 22 in the direction of removal of the terminal block 10, and thus the first protruding portion 13 would strike against the catch portion 22a, preventing the terminal block 10 from coming out in the direction of the arrow Y. Furthermore, because the key-shaped (tab-shaped) protrusion of the third protruding portion 15 interlocks with the protruding part of the locking portion 23a, the terminal block 10 is prevented even more reliably from coming out in the direction of the arrow Y.

Locking the Terminal Block by the Slide Member

Figure 4:
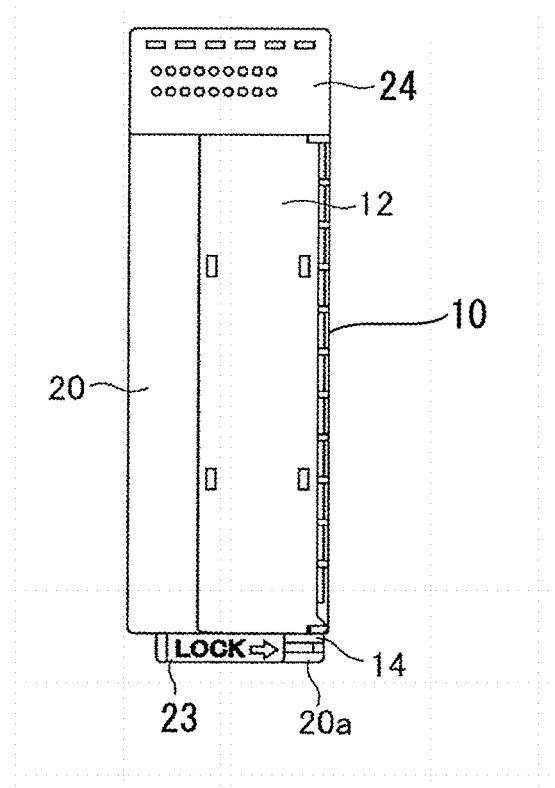
FIG. 4 is a diagram when the controlling device in a provisionally secured state is viewed from the direction of arrow B in FIG. 1.

FIG. 4 is a diagram viewing the controlling device 100, in the provisionally secured state, from the direction of the arrow B in FIG. 1. In the provisionally secured state, the slide member 23, as illustrated in FIG. 4, is positioned in the released state, enabling the second protruding portion 14 to be checked from above. When the slide member 23 that is in this released state is slid in the direction of the arrow Z in FIG. 1, the terminal block 10 that is attached to the controlling device main unit 20 is locked.

Figure 5:
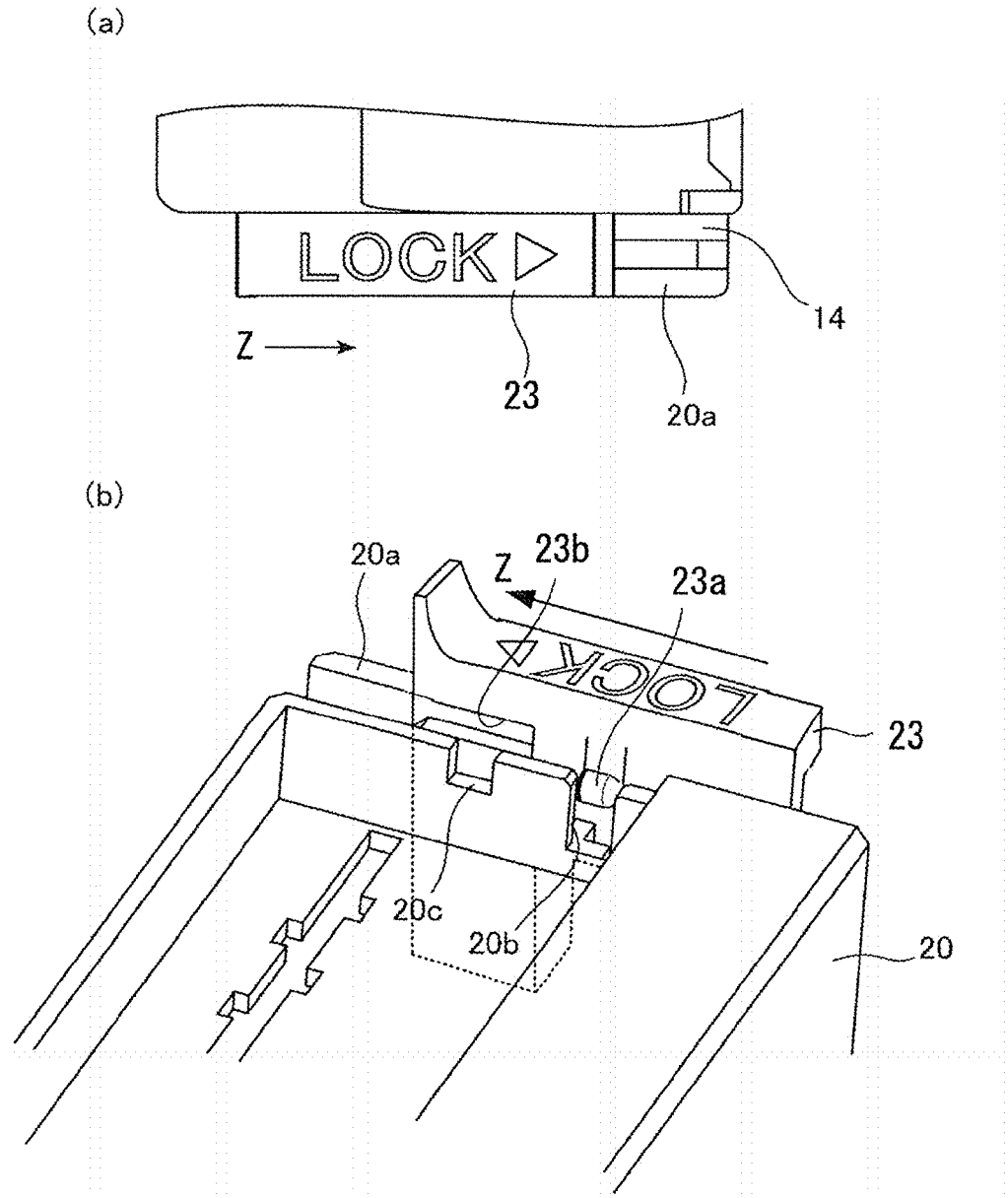
FIG. 5 is a diagram illustrating the state wherein the slide member is released in the controlling device.
Figure 6:
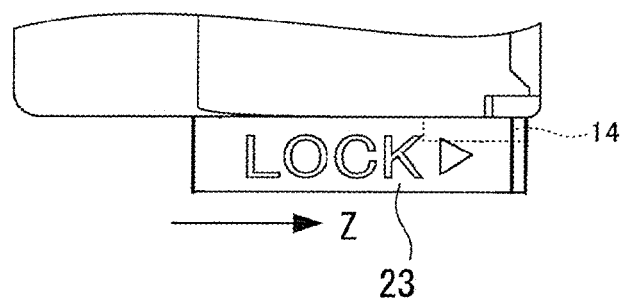
FIG. 6 is a diagram illustrating the state wherein the slide member is secured in the controlling device.
Figure 6:
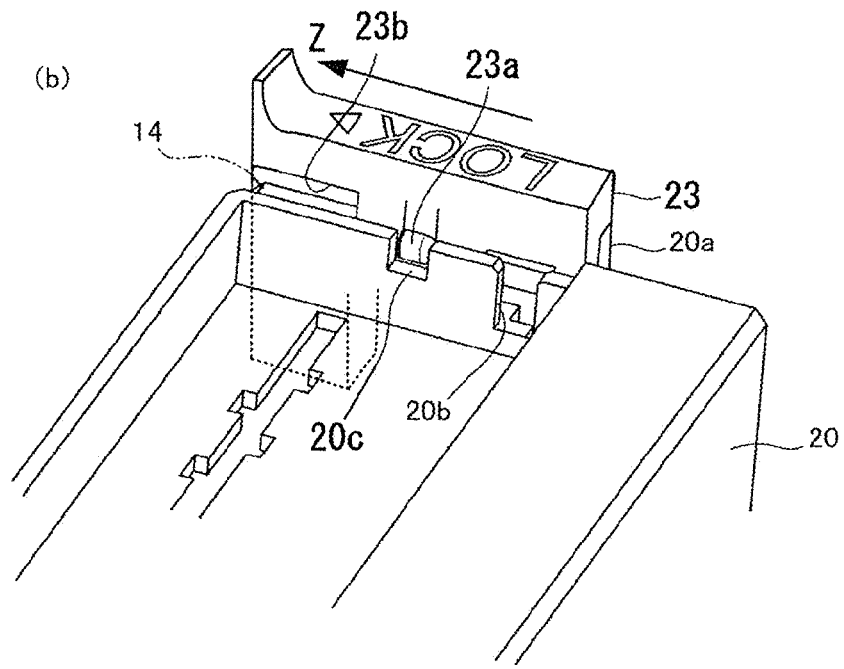

FIG. 5 shows the released state of the slide member 23, and FIG. 6 shows the secured state of the slide member 23. FIG. 5(a) and FIG. 6(a) are diagrams showing the slide member 23 from above, and FIG. 5(b) and FIG. 6(b) are oblique views showing the securing member 20a, which includes the slide member 23, from the inside of the controlling device main unit 20.

A rectangular fitting groove portion 23b, into which the second protruding portion 14 can fit, is formed on the inside of the slide member 23. Furthermore, a rectangular release position groove 28b and lock position groove 20c, into which the locking portion 23a can fit, are formed in the side face of the controlling device main unit 20 wherein the slide member 23 is provided.

In the released state illustrated in FIG. 5, the locking portion 23a fits in the release position groove 20b, and the second protruding portion 14 is positioned to the outside of the slide member 23. In this released state, when the slide member 23 slides in the Z direction, then, as illustrated in FIG. 6, the second protruding portion 14 of the terminal block 10 and the fitting groove portion 23b of the slide member 23 fit together, and also the locking portion 23a of the slide member 23, which had been fitted in the release position groove 20b, moves in the direction of the Z arrow as it flexes, to fit into the lock position groove 20c, to lock the terminal block 10 that is attached to the controlling device main unit 20.

Identifying the Type of Terminal Block that is Attached

In the state wherein the terminal block 10 is attached to the controlling device main unit 20, the first and second permanent magnet placement portions 16-1 and 16-2 that are formed on the lower front face portion of the terminal block 10 are in proximity to the first and second Hall ICs 28-1 and 28-2 on the printed substrate 26 that is contained within the controlling device main unit 20.

In this example, first and second permanent magnets 17-1 and 17-2 are placed in the first and second permanent magnet placement portions 16-1 and 16-2, and thus the first and second Hall ICs 28-1 and 28-2 detect, respectively, the magnetism of the first and second permanent magnets 17-1 and 17-2, to output detection signals indicating whether or not there is magnetism.

The detection signals from the first and second Hall ICs 28-1 and 28-2, indicating whether or not there is magnetism, are sent to a controlling portion 27 that is mounted on the printed substrate 25. Note that the first and second Hall ICs 28-1 and 28-2 send, to a controlling portion 27, a detection signal with a level of "1" if magnetism is detected, and send, to the controlling portion 27, a detection signal with a level of "0" if magnetism is not detected.

Figure 8:
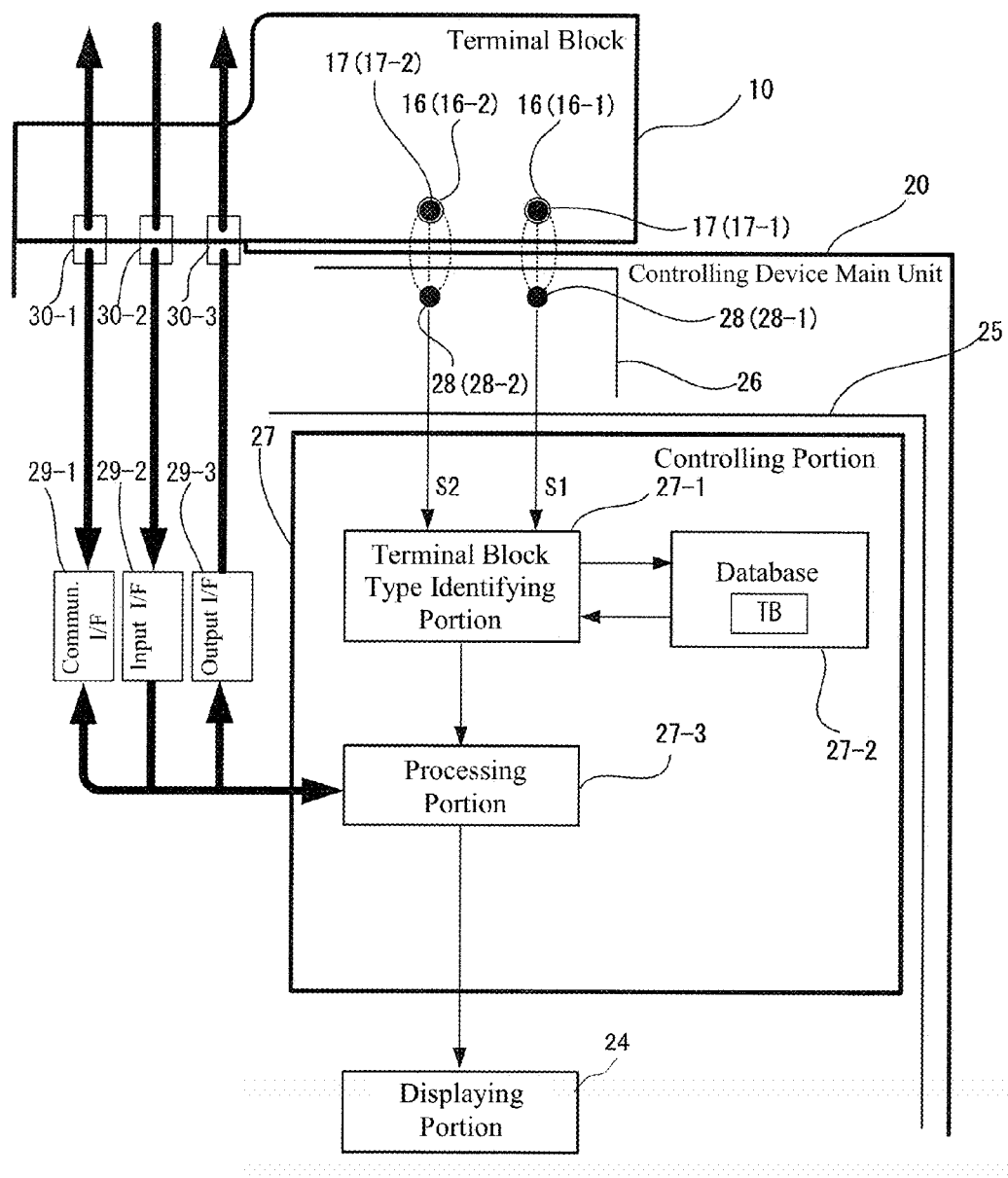
FIG. 8 is a functional block diagram of the controlling portion in the controlling device.

FIG. 8 shows a functional block diagram of the controlling portion 27. The controlling portion 27 is provided with: a terminal block type identifying portion 27-1 that inputs a detection signal S1, sent from the first Hall IC 28-1, indicating whether or not there is magnetism, and inputs a detection signal S2, sent from the second Hall IC 28-2, indicating whether or not there is magnetism, to identify, based on these detection signals S1 and S2, the type of terminal block 10 that is attached to the controlling device main unit 20; a database portion 27-2 that stores a type identification table TB that is used when the terminal block type identifying portion 27-1 identifies the type of terminal block 10; and a processing portion 27-3 for receiving the results of the identification of the type of the terminal block 10, by the terminal block type identifying portion 27-1, and for performing various types of processes.

Example

Figure 9:
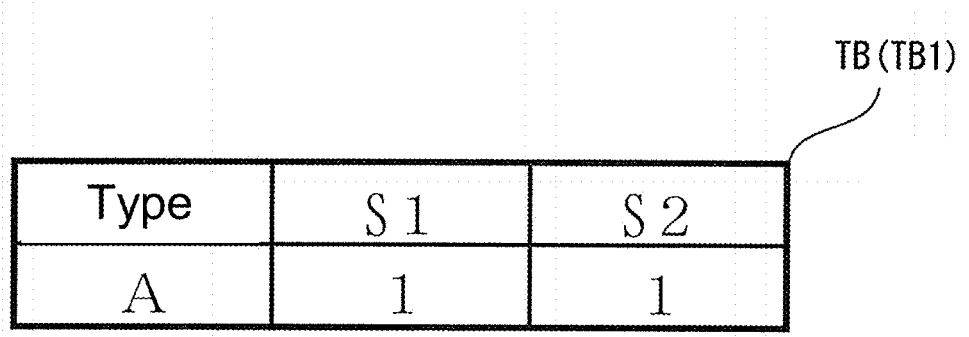
FIG. 9 is a diagram illustrating Example of a type identification table that is stored in a database portion of the controlling portion.

FIG. 9 is a diagram illustrating Example of a type identification table TB that is stored in a database portion 27-2. In the type identification table TB (TB1) in the Example, a relationship is established, in relation to the level of the detection signal S1 from the first Hall IC 28-1 and the level of the detection signal S2 from the second Hall IC 28-2, indicating that if the levels of both of these detection signals S1 and S2 are "1" then the terminal block 10 that is attached to the controlling device main unit 20 is of type A. That is, a relationship is established indicating that, when the binary code indicated by the detection signals S1 and S2 is "11", the terminal block 10 that is attached is of type A.

For example, a terminal blocks 10 may be one of various types of terminal blocks such as an input terminal block or an output terminal block. If here the terminal block that should be attached to the controlling device main unit 20 is defined as an input terminal block, this input terminal block is defined as a type A terminal block, and binary code indicating this type A is established in the type identification table TB1.

The terminal block type identifying portion 27-1 uses this type identification table TB1 to identify the type of terminal block 10 that is attached to the controlling device main unit 20. That is, the terminal block type identifying portion 27-1 inputs the detection signals S1 and S2 from the first and second Hall ICs 28-1 and 28-2, and, in accordance with the relationship established in the type identification table TB1, identifies the terminal block 10 that is attached to the controlling device main unit 20 as type A if the levels of both of the detection signals S1 and S2 are "1".

In contrast, if the levels of the detection signals S1 and S2 are not both "1", then the terminal block type identifying portion 27-1 identifies that the terminal block 10 that is attached to the controlling device main unit 20 is not of type A. Note that if the levels of both of the detection signals S1 and S2 are "0", then the terminal block type identifying portion 27-1 identifies that no terminal block 10 is attached to the controlling device main unit 20.

The identification result for the type of terminal block 10, by this terminal block type identifying portion 27-1 (an identification result that includes whether or not a terminal block 10 is attached) is sent to the processing portion 27-3. The processing portion 27-3 not only sends the result of identification, by the terminal block type identifying portion 27-1, to the displaying portion 24, to be displayed, but if the terminal block 10 that is attached to the controlling device main unit 20 is of type A, also determines that the terminal block is the correct terminal block, and activates the functions of the various types of signal processing (communication, DI/DO, AI/AO) between the controlling portion 27 and the terminal block 10. If the terminal block 10 that is attached to the controlling device main unit 20 is not of type A, then the terminal block is not correct, and the functions of the various types of signal processing between the controlling portion 27 and the terminal block 10 are stopped.

Note that in FIG. 8, 29-1 is a communication interface (communication I/F), 29-2 is an input interface (input I/F), and 29-3 is an output interface (output I/F), where communication signal processes with the terminal block 10 are performed through the communication I/F 29-1, input signal processes (DI/AI) with the terminal block 10 are performed through the input I/F 29-2, and output signal processes (DO/AO) with the terminal block 10 are performed through the output I/F 29-3. Attaching the terminal block 10 to the controlling device main unit 20 connects the terminal block 10 to the communication I/F 29-1, the input I/F 29-2, and the output I/F 29-3 through contact portions 30-1, 30-2, and 30-3. The terminal block 10 is connected to the outside, so the various types of signal processes with the controlling portion 27, described above, are performed as signal processes with a device that is connected on the outside.

Another Example

Figure 10:
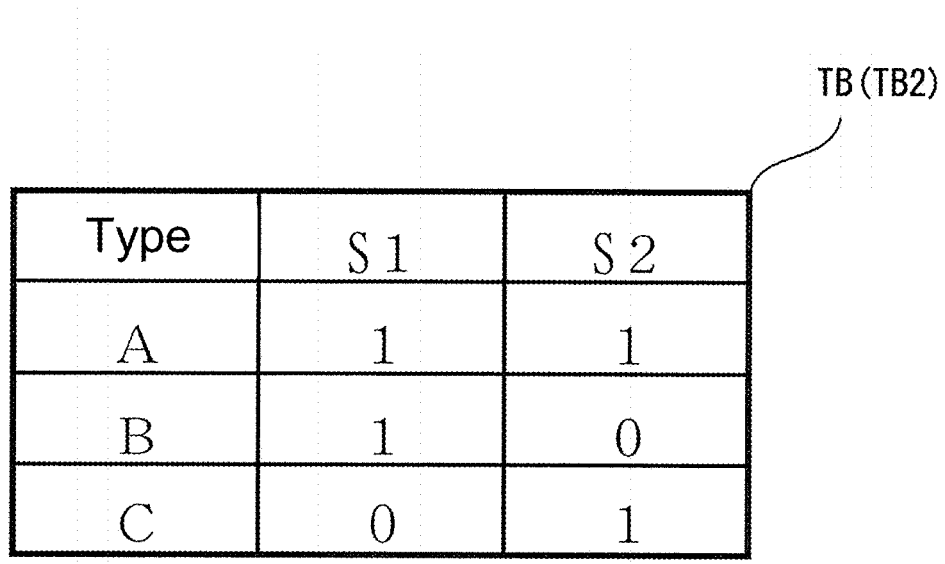
FIG. 10 is a diagram illustrating Another Example of a type identification table that is stored in a database portion of the controlling portion.

FIG. 10 is a diagram illustrating Another Example of a type identification table TB that is stored in a database portion 27-2. In the type identification table TB (TB2) in the Example, relationships are established, in relation to the level of the detection signal S1 from the first Hall IC 28-1 and the level of the detection signal S2 from the second Hall IC 28-2, indicating that if the levels of both of these detection signals S1 and S2 are "1" then the terminal block 10 that is attached to the controlling device main unit 20 is of type A, if "1" and "0", then it is of type B, and if "0" and "1", then it is of type C. That is, relationships are established indicating that, when the binary code indicated by the detection signals S1 and S2 is "11", the terminal block 10 that is attached is of type A, if "10", it is of type B, and if "01", it is of type C.

The terminal block type identifying portion 27-1 uses this type identification table TB2 to identify the type of terminal block 10 that is attached to the controlling device main unit 20. That is, the terminal block type identifying portion 27-1 inputs the detection signals S1 and S2 from the first and second Hall ICs 28-1 and 28-2, and, in accordance with the relationship established in the type identification table TB2, identifies the terminal block 10 that is attached to the controlling device main unit 20 as type A if the levels of both of the detection signals S1 and S2 are "1".

In contrast, if the levels of the detection signals S1 and S2 are "1" and "0", then the terminal block type identifying portion 27-1 identifies that the terminal block 10 that is attached to the controlling device main unit 20 is of type B, and if the levels of the detection signals S1 and S2 are "0" and "1", then the terminal block type identifying portion 27-1 identifies that the terminal block 10 that is attached to the controlling device main unit 20 is of type C. Note that if the levels of both of the detection signals S1 and S2 are "0", then the terminal block type identifying portion 27-1 identifies that no terminal block 10 is attached to the controlling device main unit 20.

The identification result for the type of terminal block 10, by this terminal block type identifying portion 27-1 (an identification result that includes whether or not a terminal block 10 is attached) is sent to the processing portion 27-3. The processing portion 27-3 not only sends the result of identification, by the terminal block type identifying portion 27-1, to the displaying portion 24, to be displayed, but if the terminal block 10 that is attached to the controlling device main unit 20 is of type A, also activates the functions of the various types of signal processing between the controlling portion 27 and the terminal block 10, defines the functions of type A, and performs signal processing operations in accordance with the functions of type A. The same is true for the case of type B or C, where the functions of the various types of signal processing between the controlling portion 27 are activated, the functions of type B or C are defined, and signal processing operations in accordance with the functions of type B or C are performed.

Further Example

Figure 11:
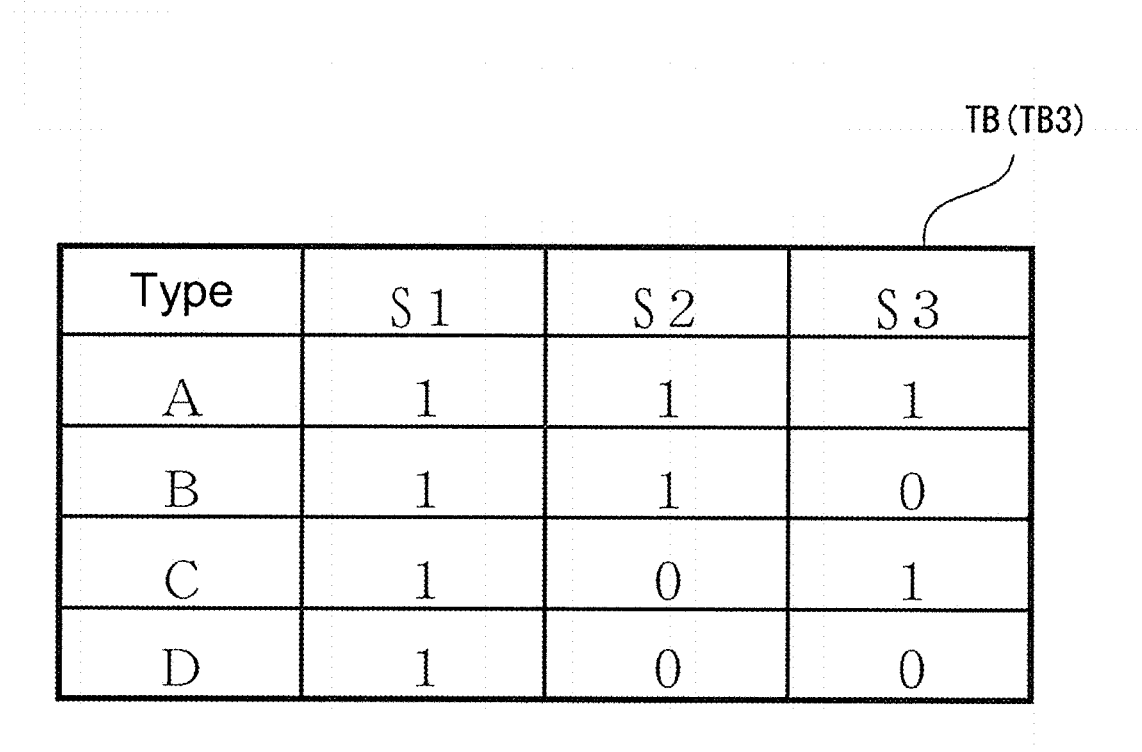
FIG. 11 is a diagram illustrating Further Example of a type identification table that is stored in a database portion of the controlling portion.
Figure 12:
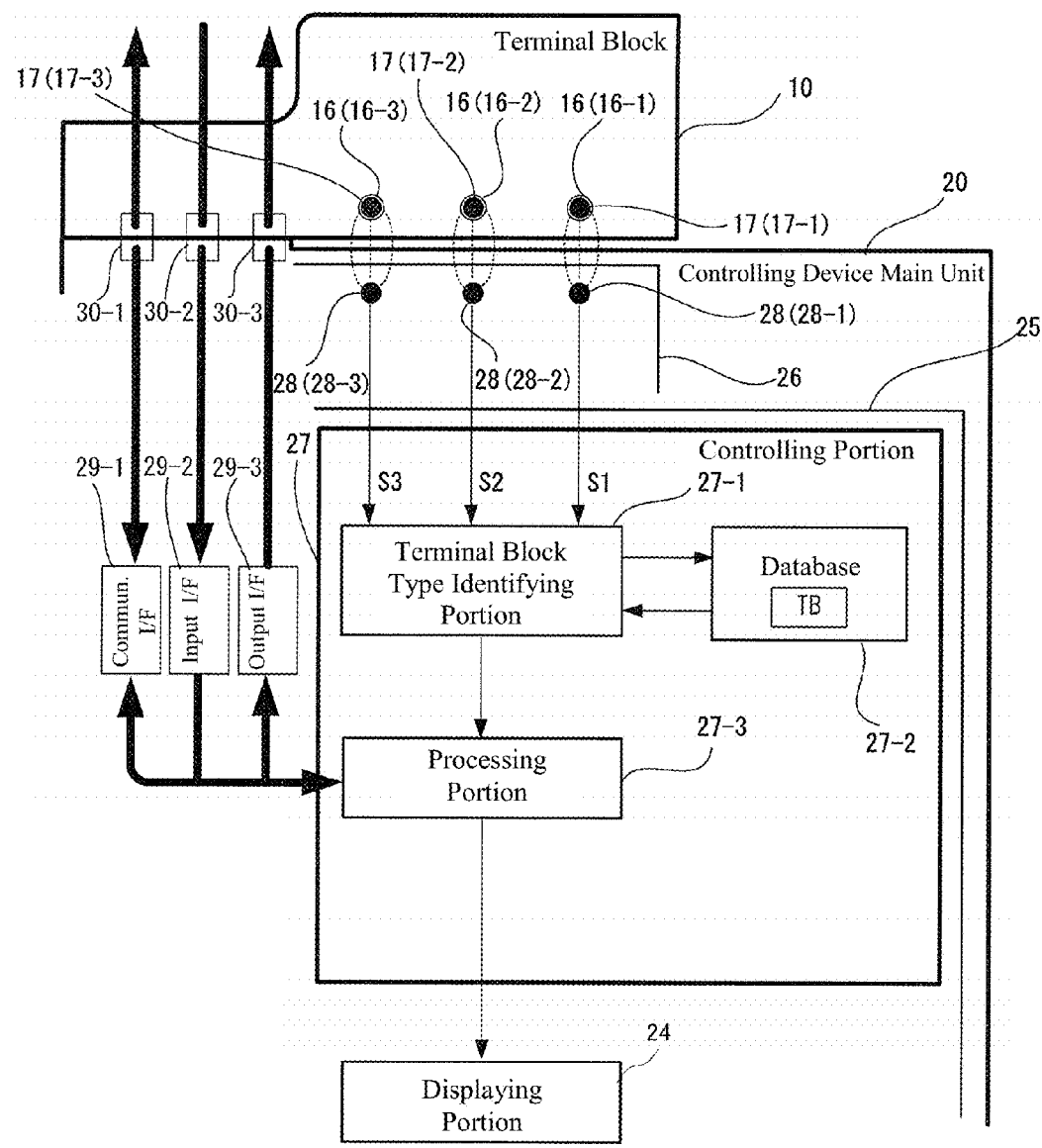
FIG. 12 is a functional block diagram of the controlling portion in a case wherein the type identification table of the Further Example is used.

FIG. 11 is a diagram illustrating Further Example of a type identification table TB that is stored in a database portion 27-2. When the type identification table TB (TB3) of the Further Example is used, three permanent magnet placement portions 16, as illustrated in FIG. 12, are formed in the terminal block 10, and permanent magnets 17 are placed selectively in these three permanent magnet placement portions 16. First, second, and third Hall ICs 28-1, 28-2, and 28-3 are provided corresponding to the first, second, and third permanent magnet placement portions 16-1, 16-2, and 16-3 on the printed substrate 26 that is contained within the controlling device main unit 20.

Note that FIG. 12 illustrates an example wherein the first, second, and third permanent magnet placement portions 16-1, 16-2, and 16-3 are formed in the terminal block 10, and first, second, and third permanent magnets 17-1, 17-2, and 17-3 are placed in the first, second, and third permanent magnet placement portions 16-1, 16-2, and 16-3.

In this case, in the state wherein a terminal block 10 is attached to the controlling device main unit 20, the first, second, and third permanent magnet placement portions 16-1, 16-2, and 16-3 are in proximity to the first, second, and third Hall ICs 28-1, 28-2, and 28-3, and detection signals S1, S2, and S3, indicating whether or not there is magnetism, are sent to the controlling portion 27 from the first, second, and third Hall ICs 28-1, 28-2, and 28-3.

In the type identification table TB3 in the Example, relationships are established, in relation to the level of the detection signal S1 from the first Hall IC 28-1, the level of the detection signal S2 from the second Hall IC 28-2, and the level of the detection signal S3 from the third Hall IC 28-3, indicating that if the level of the detection signal S1 is "1" then a terminal block 10 is attached, and if the levels of both of the detection signals S2 and S3 are "1" then the terminal block 10 that is attached to the controlling device main unit 20 is of type A, if "1" and "0", then it is of type B, if "0" and "1", then it is of type C, and if "0" and "0", then it is of type D.

That is, relationships are established wherein the first bit of the binary code indicated by the detection signals S1, S2, and S3 indicates whether or not a terminal block 10 is attached, and the remaining bits are bits that indicate the type of terminal block 10, where if the code indicated by the remaining bits is "11", the terminal block 10 that is attached is of type A, if "10", it is of type B, if "01", it is of type C, and if "00", it is of type D.

The terminal block type identifying portion 27-1 uses this type identification table TB3 to identify whether or not a terminal block 10 that is attached to the controlling device main unit 20, and to identify the type of terminal block 10 that is attached. That is, the terminal block type identifying portion 27-1 inputs the detection signals S1, S2, and S3 from the first, second, and third Hall ICs 28-1, 28-2, 28-3, and, in accordance with the relationships established in the type identification table TB3, identifies the type of terminal block 10 that is attached to the controlling device main unit 20 if the level of the detection signal S1 is "1". Additionally, if it has been identified that a terminal block 10 is attached to the controlling device main unit 20, then the levels of the detection signals S2 and S3 are checked, and if the levels of the detection signals S2 and S3 are both "1", the terminal block 10 that is attached to the controlling device main unit 20 is identified as being of type A.

In contrast, if the levels of the detection signals S2 and S3 are "1" and "0", then the terminal block type identifying portion 27-1 identifies that the terminal block 10 that is attached to the controlling device main unit 20 is of type B, and if the levels of the detection signals S2 and S3 are "0" and "1", the terminal block 10 that is attached to the controlling device main unit 20 is identified as being of type C, but if the levels of the detection signals S2 and S3 are "0" and "0", the terminal block 10 that is attached to the controlling device main unit 20 is identified as being of type D. Note that if the level of the detection signal S1 is "0", then the terminal block type identifying portion 27-1 identifies that no terminal block 10 is attached to the controlling device main unit 20.

The identification result for the type of terminal block 10, by this terminal block type identifying portion 27-1 (an identification result that includes whether or not a terminal block 10 is attached) is sent to the processing portion 27-3. The processing portion 27-3 not only sends the result of identification, by the terminal block type identifying portion 27-1, to the displaying portion 24, to be displayed, but if the terminal block 10 that is attached to the controlling device main unit 20 is of type A, also activates the functions of the various types of signal processing between the controlling portion 27 and the terminal block 10, defines the functions of type A, and performs signal processing operations in accordance with the functions of type A. The same is true for the case of types B, C, and D, where the functions of the various types of signal processing between the controlling portion 27 are activated, the functions of types B, C, and D are defined, and signal processing operations in accordance with the functions of types B, C, and D are performed.

Another Further Example

Figure 13:
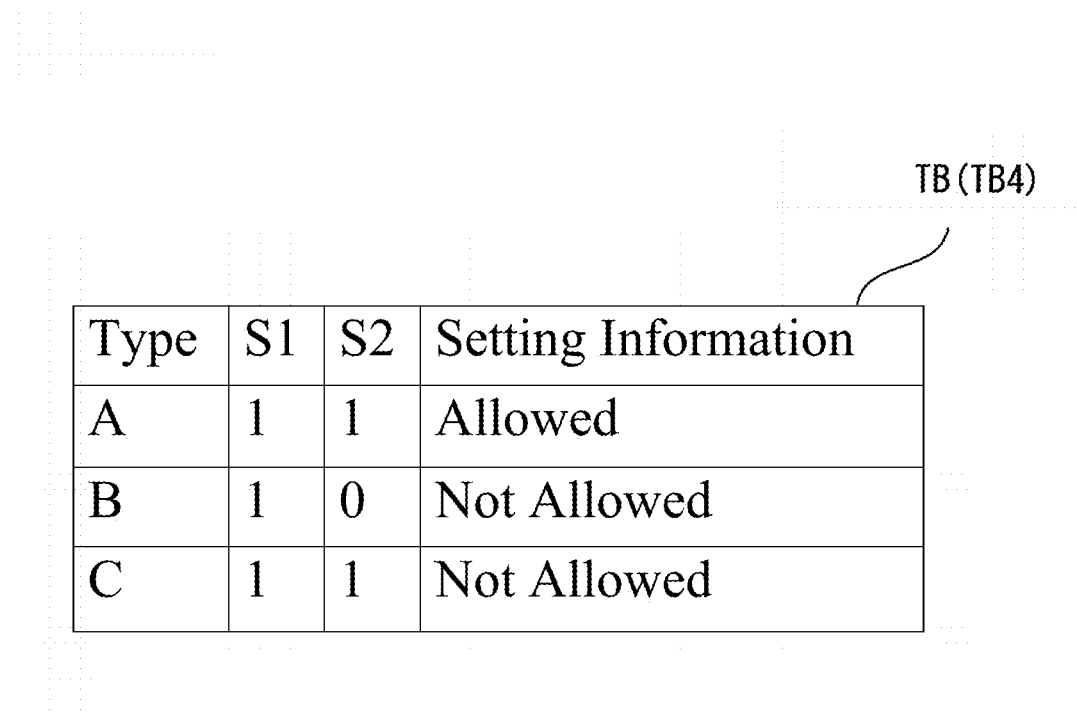
FIG. 13 is a diagram illustrating Another Further Example of a type identification table that is stored in a database portion of the controlling portion.

FIG. 13 is a diagram illustrating Another Further Example of a type identification table TB that is stored in a database portion 27-2. The type identification table TB (TB4) in the Another Further Example is a modified example of the type identification table TB (TB2) in the Another Example. In the type identification table TB4 in the Another Further Example information indicating Allowed or Not-allowed is set for each type of terminal block 10. In this example, information indicating Allowed is set for a terminal block 10 of type A, and information indicating Not-allowed is set for terminal blocks 10 of types B and C. The setup of the Allowed/Not-allowed information is performed through an external device (not shown) through communication with an attached personal computer, or the like, and can be overwritten if necessary.

The terminal block type identifying portion 27-1 (FIG. 8) uses this type identification table TB4 to identify the type of terminal block 10 that is attached to the controlling device main unit 20. That is, the terminal block type identifying portion 27-1 inputs the detection signals S1 and S2 from the first and second Hall ICs 28-1 and 28-2, and, in accordance with the relationship established in the type identification table TB4, identifies the terminal block 10 that is attached to the controlling device main unit 20 as type A if the levels of both of the detection signals S1 and S2 are "1".

In contrast, if the levels of the detection signals S1 and S2 are "1" and "0", then the terminal block type identifying portion 27-1 identifies that the terminal block 10 that is attached to the controlling device main unit 20 is of type B, and if the levels of the detection signals S1 and S2 are "0" and "1", then the terminal block type identifying portion 27-1 identifies that the terminal block 10 that is attached to the controlling device main unit 20 is of type C. Note that if the levels of both of the detection signals S1 and S2 are "0", then the terminal block type identifying portion 27-1 identifies that no terminal block 10 is attached to the controlling device main unit 20.

The identification result for the type of terminal block 10, by this terminal block type identifying portion 27-1 (an identification result that includes whether or not a terminal block 10 is attached) is sent to the processing portion 27-3, along with the Allowed/Not-allowed information that is set for these types of terminal blocks 10. The processing portion 27-3 not only sends the results of identification (identification results including whether or not a terminal block 10 is attached, and including the Allowed/Not-allowed setting information) by the terminal block type identifying portion 27-1 to the displaying portion 24, to be displayed, but if the terminal block 10 that is attached to the controlling device main unit 20 is of type A, also follows the Allowed information that is set for a terminal block 10 of this type, type A, to activate the functions of the various types of signal processing between the controlling portion 27 and the terminal block 10, defines the functions of type A, and performs signal processing operations in accordance with the functions of type A. If of type B or C, the Not-allowed information that is set for terminal blocks 10 of types B and C is followed, and the functions of the various types of signal processing between the controlling portion 27 and the terminal block 10 are stopped.

Yet Another Further Example

Figure 14:
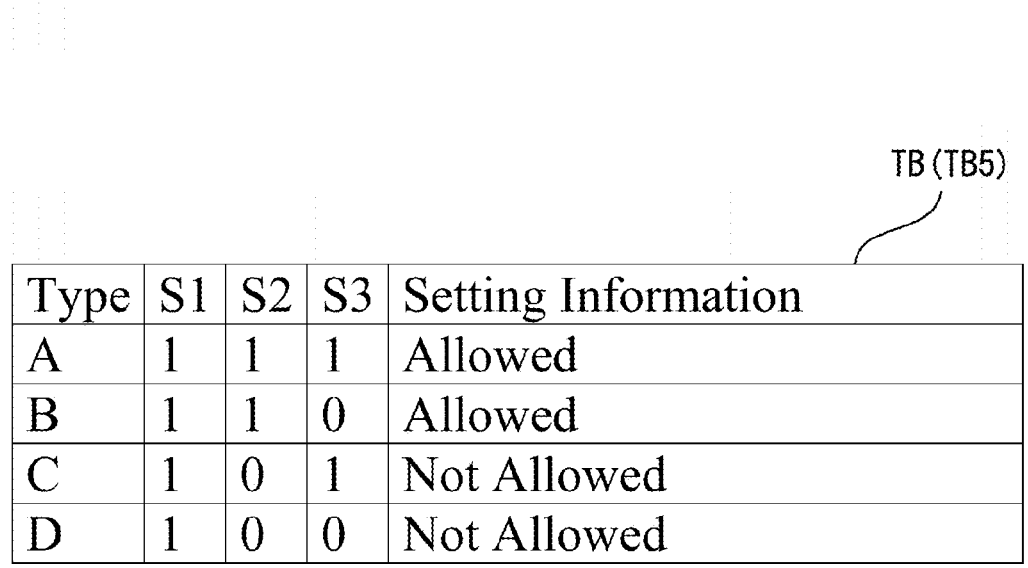
FIG. 14 is a diagram illustrating Yet Another Further Example of a type identification table that is stored in a database portion of the controlling portion.

FIG. 14 is a diagram illustrating Yet Another Further Example of a type identification table TB that is stored in a database portion 27-2. The type identification table TB (TB5) in the Yet Another Further Example is a modified example of the type identification table TB (TB3) in the Further Example. In the type identification table TB5 in the Yet Another Further Example as well, as with the type identification table TB4 in the Another Further Example, information indicating Allowed or Not-allowed is set for each type of terminal block 10. In this example, information indicating Allowed is set for terminal blocks 10 of types A and B, and information indicating Not-allowed is set for terminal blocks 10 of types C and D.

The terminal block type identifying portion 27-1 (FIG. 12) uses this type identification table TB5 to identify the type of terminal block 10 that is attached to the controlling device main unit 20. That is, the terminal block type identifying portion 27-1 inputs the detection signals S1, S2, and S3 from the first, second, and third Hall ICs 28-1, 28-2, 28-3, and, in accordance with the relationships established in the type identification table TB5, identifies the type of terminal block 10 that is attached to the controlling device main unit 20 if the level of the detection signal S1 is "1". Additionally, if it has been identified that a terminal block 10 is attached to the controlling device main unit 20, then the levels of the detection signals S2 and S3 are checked, and if the levels of the detection signals S2 and S3 are both "1", the terminal block 10 that is attached to the controlling device main unit 20 is identified as being of type A.

In contrast, if the levels of the detection signals S2 and S3 are "1" and "0", then the terminal block type identifying portion 27-1 identifies that the terminal block 10 that is attached to the controlling device main unit 20 is of type B, and if the levels of the detection signals S2 and S3 are "0" and "1", the terminal block 10 that is attached to the controlling device main unit 20 is identified as being of type C, but if the levels of the detection signals S2 and S3 are "0" and "0", the terminal block 10 that is attached to the controlling device main unit 20 is identified as being of type D. Note that if the level of the detection signal S1 is "0", then the terminal block type identifying portion 27-1 identifies that no terminal block 10 is attached to the controlling device main unit 20.

The identification result for the type of terminal block 10, by this terminal block type identifying portion 27-1 (an identification result that includes whether or not a terminal block 10 is attached) is sent to the processing portion 27-3, along with the Allowed/Not-allowed information that is set for these types of terminal blocks 10. The processing portion 27-3 not only sends the results of identification (identification results including whether or not a terminal block 10 is attached, and including the Allowed/Not-allowed setting information) by the terminal block type identifying portion 27-1 to the displaying portion 24, to be displayed, but if the terminal block 10 that is attached to the controlling device main unit 20 is of type A or B, also follows the Allowed information that is set for a terminal block 10 of these types, types A and B, to activate the functions of the various types of signal processing between the controlling portion 27 and the terminal block 10, defines the functions of types A and B, and performs signal processing operations in accordance with the functions of types A and B. If of type C or D, the Not-allowed information that is set for terminal blocks 10 of types C and D is followed, and the functions of the various types of signal processing between the controlling portion 27 and the terminal block 10 are stopped.

As can be understood from the explanation above, with the controlling device 100 according to the present example, the terminal block 10 is provided with a plurality of permanent magnet placement portions 16, and the controlling device main unit 20 is provided with Hall ICs (magnetism detecting portions) 28 which, when in a state wherein a terminal block 10 is attached, are positioned at positions in proximity permanent magnet placement portions 16, to detect the magnetism of the permanent magnets 17 that are positioned selectively in the placement portions 16, where the type of terminal block 10 that is attached to the controlling device main unit 20 is identified based on the detection signals, indicating the presence or absence of magnetism, from the Hall ICs 28, thus making it possible to identify the type of terminal block 10 that is attached, without having a difference in the shape of the connector and without using a portion of the pins of the connector.

Note that although in the Example, Another Example, and Another Further Example, above, the number of permanent magnet placing portions 16 in the terminal block 10 was two, and although in the Further Example and Yet Another Further Example, above, the number of permanent magnet placing portions 16 in the terminal block 10 was three, these numbers may be expanded further. Furthermore, while the permanent magnet placement portions 16 were arranged in a single horizontal row, the number of rows may be expanded further.

Moreover, while in the Further Example and Yet Another Further Example, set forth above, a detection signal S1 from a first Hall IC 28-1 was used for identifying whether or not a terminal block 10 was attached, there is no limitation to a detection signal S1 from the first Hall IC 28-1, but rather the detection signal S2 or S3, from another Hall IC 28-2 or 28-3, may be used instead as the signal for identifying whether or not a terminal block 10 is attached.

Because the first Hall IC 28-1 detects the magnetism of the first permanent magnet 17-1 that is disposed in the terminal block 10, that is, because it detects the magnetism of the first permanent magnet 17-1 that is disposed in a position that is far from the fitting indentation 22 and the protruding portion 30 that are the support point when attaching the terminal block 10 to the controlling device main unit 20, the magnetism of the first permanent magnet 17-1 can only be detected when the terminal block 10 is completely attached to the controlling device main unit 20, and the magnetism of the permanent magnet 17-1 becomes undetectable immediately after the terminal block 10 is removed from the controlling device main unit 20. Consequently, it can be said that the location of the first Hall IC 28-1 is the best location as the location for detecting whether or not the terminal block 10 is attached.

Moreover, it is anticipated that this type of controlling device 100 will be installed in a hostile environment, and that dust and dirt will become adhered thereto. In the present example, pairs of permanent magnets 17 and Hall ICs 28 are used for identifying the type of terminal block 10, enabling the type of terminal block 10 to be identified without contact, which is superior in terms of environmental resistance and is unaffected by the ambient dust and dirt, enabling the function for identifying the type of terminal block 10 to be maintained stably over an extended period of time.

Moreover, while in the examples set forth above the result of identification by the terminal block type identifying portion 27-1 (an identification result that includes whether or not a terminal block 10 is attached and includes allowed/not allowed setting information) was sent by the processing portion 27-3 to the displaying portion 24, instead the communication function of the controlling device 100 may be used to send the identification result through a network or the Internet to a peripheral controlling device (external device).

Extended Examples

While the present invention has been explained above in reference to examples, the present invention is not limited to the examples set forth above. The structures and details in the present invention may be varied in a variety of ways, as can be understood by one skilled in the art, within the scope of technology in the present invention.

The invention claimed is:

1. A controlling device comprising:
a controlling device main unit; and
a terminal block attached removably to the controlling device main unit, wherein
the terminal block is provided with
first through $N^{th}$ ($N \geq 2$) permanent magnet placement portions,
the controlling device main unit includes
first through $N^{th}$ magnetism detecting portions that, in a state wherein the terminal block is attached, are positioned at positions in proximity to the first through $N^{th}$ permanent magnet placement portions, to detect respective magnetism of permanent magnets that are placed selectively in the placement portions, and
a terminal block type identifying portion that identifies a type of the terminal block attached to the controlling device main unit based on detection signals, indicating whether or not there is magnetism, from the first through $N^{th}$ magnetism detecting portions, and
the terminal block type identifying portion identifies the type of the terminal block attached to the controlling device main unit, using a type identification table indicating relationships between a plurality of types of the terminal block and the detection signals, the type identification table being defined in advance and stored in a database portion of the controlling device main unit.

2. The controlling device as set forth in claim 1, wherein:
the terminal block type identifying portion identifies, from a detection signal, indicating whether or not there is magnetism, from one magnetism detecting portion established in advance from among the first through $N^{th}$ magnetism detecting portions, whether or not a terminal block is attached to the controlling device main unit, and identifies the type of terminal block that is attached to the controlling device main unit, based on detection signals, indicating whether or not there is magnetism, from the other magnetism detecting portions.

3. The controlling device as set forth in claim 1, wherein
the terminal block type identifying portion identifies whether or not to stop functions of various types of signal processing between the controlling device main unit and the terminal block, together with identifying the type of terminal block attached to the controlling device main unit, based on information indicating Allowed or Not-allowed, set for each of the plurality of types of the terminal block, and
the information is set through an external device connected to communicate with the controlling device main unit.

* * * * *